United States Patent [19]

Lobe

[11] Patent Number: 4,555,638

[45] Date of Patent: Nov. 26, 1985

[54] FUSE AND DISTRIBUTION ARRANGEMENT BOX FOR MOTOR VEHICLES

[75] Inventor: Hartwig Lobe, Unterschleissheim, Fed. Rep. of Germany

[73] Assignee: Bayerische Motoren Werke AG, Fed. Rep. of Germany

[21] Appl. No.: 696,862

[22] Filed: Jan. 30, 1985

Related U.S. Application Data

[63] Continuation of Ser. No. 355,734, filed as PCT EP 81/00020, Jun. 11, 1981, § 102(e) date Feb. 12, 1982, abandoned.

[30] Foreign Application Priority Data

Jun. 12, 1980 [DE] Fed. Rep. of Germany ....... 3022115

[51] Int. Cl.$^4$ .............................................. H05K 1/18
[52] U.S. Cl. ............................... 307/10 R; 339/17 C; 361/399; 361/407; 361/360
[58] Field of Search ............. 339/17 C, 193 P, 147 R; 337/198, 297, 268, 255; 361/395, 399, 356-358, 360, 361, 407, 400, 405

[56] References Cited

U.S. PATENT DOCUMENTS

| | | | |
|---|---|---|---|
| 2,603,681 | 7/1952 | Salisbury | 339/193 P |
| 3,334,325 | 8/1967 | Conrad | 361/407 |
| 3,491,267 | 1/1970 | Goshorn | 361/407 |
| 3,514,737 | 5/1970 | Renshaw | 339/17 C |
| 3,775,723 | 11/1973 | Mamrick | 337/297 |

FOREIGN PATENT DOCUMENTS

| | | |
|---|---|---|
| 7327573 | 11/1973 | Fed. Rep. of Germany . |
| 2511459 | 9/1976 | Fed. Rep. of Germany . |
| 2279315 | 2/1976 | France . |
| 2022333 | 12/1979 | United Kingdom . |

OTHER PUBLICATIONS

IBM Tech. Discl. Bull., vol. 19, No. 5, Oct. 1976, p. 1528, Hammer, Protection of P-C Cards.

Primary Examiner—G. P. Tolin
Attorney, Agent, or Firm—Craig and Burns

[57] ABSTRACT

A fuse and distribution box arrangement for motor vehicles includes a printed circuit board with wiring in the form of a printed circuit, electrical fuses and spring-biased contacts for directly connecting consumers of power. The fuses include first and second contacts, the first contacts of which are directly connected to the printed circuit board, and the second contacts of which are directly connected to the spring-biased contacts which thereby connect consumers of power.

6 Claims, 4 Drawing Figures

FUSE AND DISTRIBUTION ARRANGEMENT BOX FOR MOTOR VEHICLES

This is a continuation of application Ser. No. 355,734 filed as PCT EP 81/00020, Jun. 11, 1981, § 102(e) date Feb. 12, 1982; now abandoned.

BACKGROUND AND SUMMARY OF THE INVENTION

The invention pertains to a fuse and distribution box arrangement for motor vehicles having a printed circuit board with wiring in the form of a printed circuit, electric fuses, and spring-biased contacts with which consumers of electricity, i.e., an electrical load, can be directly connected. The fuses include first contacts which are directly connected to the printed circuit board and second contacts which are directly connected to the spring-biased contacts which thereby connect consumers of electricity.

In the case of a known box of this same general type (DE-Gm No. 73 27 573), the consumers of electricity are connected via a patch panel which is situated in the same plane as the printed circuit board and adjacent to it. The fuses are supported by a body which covers the printed circuit board and the patch panel and which holds the connecting lines from the plugs in the patch panel to the connections of the printed circuit board.

This known box is expensive to build since it, of necessity, includes a printed circuit board, patch panel and the above-described body. In addition, the wiring of the body requires considerable expense since, when viewed in the direction of current, lines must be extend both from the patch panel to the printed circuit board and from the printed circuit board to the patch panel.

SUMMARY OF THE INVENTION

The task of the invention is to produce a fuse and distribution box generally of the type mentioned above at a low construction cost.

The invention accomplishes this task by having the second contacts of the fuses directly connecting the consumers of power.

Due to the fact that the consumers of power are connected directed to the fuses themselves, a patch panel and the lines leading from the fuses to it can be completely eliminated. This considerably reduces the number of components and means a considerable cost reduction and a significant decrease in error probability. In addition, this cuts down on size. Finally, the dimensions of the printed circuit board can be kept small since separate return lines to the patch panel are no longer needed.

In an advantageous implementation of the invention, the consumers of power are connected directly to the second contacts of the fuses by single-pole plugs or plug receptacles and cables. Thus, the connection of consumers of power to fuses, which is known per se, is combined in a structurally simple way with wiring undertaken in the form of a printed circuit.

The structural cost can be further reduced by designing the fuses as plug-in fuses with knife-like contacts. These contacts can mesh directly into the plug receptacles to which the consumers of power are connected by cables in the above-described way. In the same way, the first contacts of the fuses can mesh into a plug receptacle which is attached to the printed circuit board.

The structure of the fuse and distribution box can be made particularly simple and accessible by arranging the fuses one behind the other, at least at the edge of the printed circuit board. If the fuses are designed as described, for instance as plug-in fuses, they can be combined into a multipoint plug. In addition, with this arrangement, the state of the fuses can be checked particularly quickly.

In an additional feature of the invention, the dimensions of the printed circuit board and thus of the fuse and distribution box can be kept particularly small by ensuring that, in order to connect fuses directly to the positive potential, a busbar of positive potential is located under the printed circuit board and extends in the edge area through the printed circuit board or past it into receptacles for the first contacts of the fuses. If the feed of positive potential to the fuses were accomplished from a central point of the printed circuit board via its printed circuit, considerable space on the printed circuit board would be required since due to the high current load the strip conductors must be made appropriately wide. By removing the positive feed from the printed circuit board, only strip conductors are left on it, and as a rule these are subjected to a considerably lower current load and thus can be kept accordingly narrow.

If, as known from the publication mentioned above, the printed circuit board has relays which are connected to the printed circuit, then an advantageous refinement of the above-mentioned feature of the invention includes the running the busbar under the printed circuit board and up to the relays and with contact parts extending through the printed circuit board up to the positive inputs of the relays. Since the cables which lead to the consumers of power and are connected to the fuses are run generally sideways away from the printed circuit board, the underside of the printed circuit board is clear. The busbar can thus be adapted under the printed circuit board to any arrangement of the relays and thus assume the function of positive feed for all relays. Thus no positive feeds need to be provided on the printed circuit board.

These and other objects, features and advantages of the present invention will become more apparent from the following description when taken in connection with the accompanying drawings which show, for purposes of illustration only, one preferred embodiment in accordance with the present invention.

DRIEF DESCRIPTION OF THE DRAWINGS

FIG. 1 shows a top view, partially broken away, of a fuse and distribution box according to a preferred embodiment of the invention, FIG. 2 is a side view of the box of FIG. 1, FIG. 3 shows a partial sectional view of FIG. 2 and FIG. 4 shows a partial sectional view of FIG. 1.

DETAILED DESCRIPTION OF THE INVENTION

Figure 1:
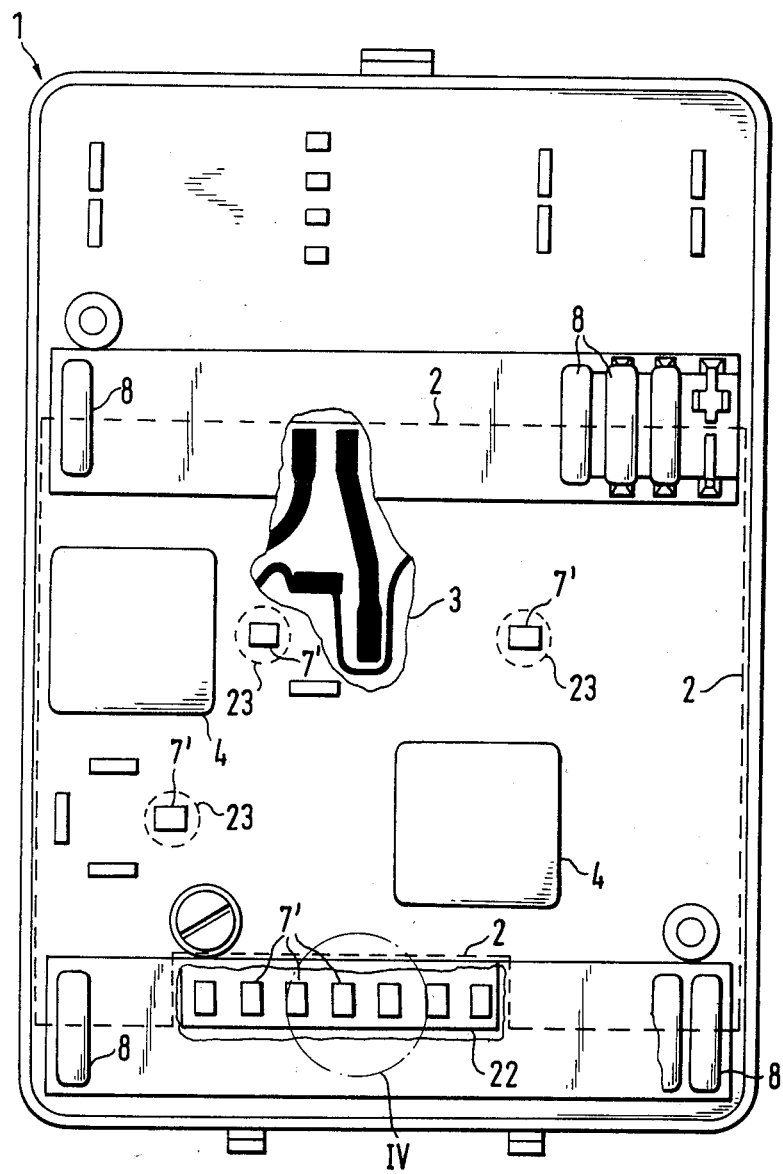

A fuse and distribution arrangement box 1 for motor vehicles contains a printed circuit board 2, which forms wiring, not shown in detail, in the form of an indicated printed circuit 3. Relays 4 which are mounted on support 5 (see FIG. 2) are also connected to circuit 3. The support 5 is part of housing portion 1' and is equipped with a cover 6.

Spring-biased contact parts 7, into which plug-in fuses 8 with knife-shaped first contacts 9 are inserted, are soldered to the two longitudinal edges of printed circuit board 2. The second contacts 9', also knife-like, of plug-in fuses 8, are used to connect consumers of power, i.e., an electrical load, not shown, directly to plug-in fuse 8 by another spring-biased contact part 10 connected to cable 11.

The electrical connection of the positive pole of the vehicle power supply to the consumers of electricity is accomplished by a threaded terminal end 12 which is on the positive potential of printed circuit 3, and plug-in fuses 8 as well as cables 11. In addition, the printed circuit connects control lines (which lead to switches not shown, for instance in the steering column assembly) to the connections of relays 4 as well as the outputs of relays 4 with plug-in fuses 8.

Due to the fact that plug-in fuses 8 are situated at the lateral edges of printed circuit board 2, accessibility is increased despite the compact structure, and the test expense for consumers of the plug-in fuses 8, relays 4 and printed circuit 3 is reduced. The consumers of power are connected to circuit 3 directly by plug-in fuses 8. These plug-in fuses 8 are connected to the consumers outside of printed circuit board 2.

Figure 2:
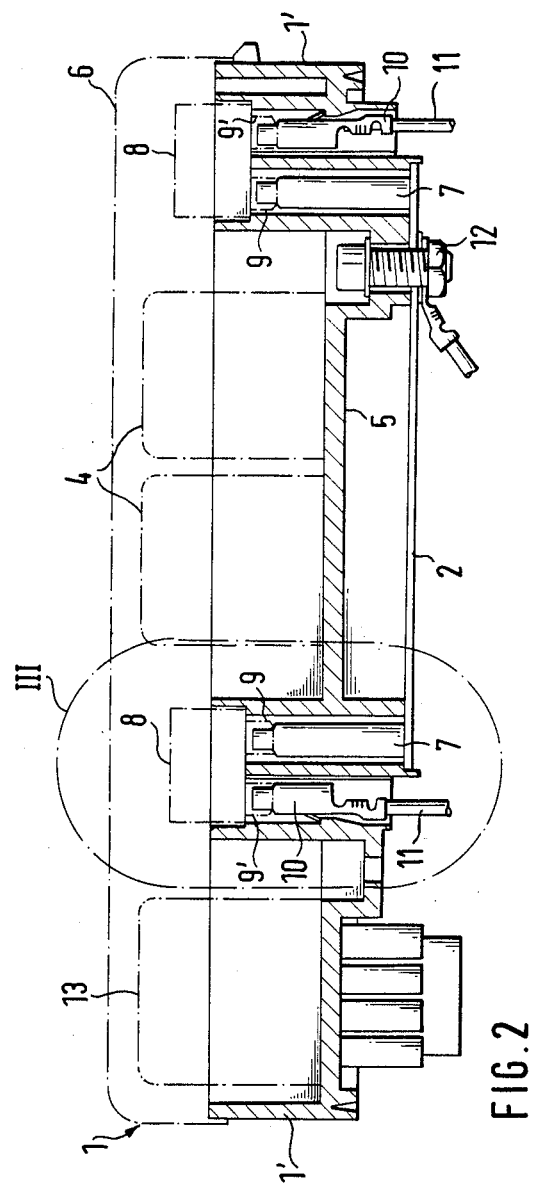

Due to the advantageous compact design of the distribution box arrangement of the instant invention, it is possible to put more components into box 1. In FIG. 2 this possibility is shown using the example of a sensor 13, the outline of which is indicated.

Figure 3:
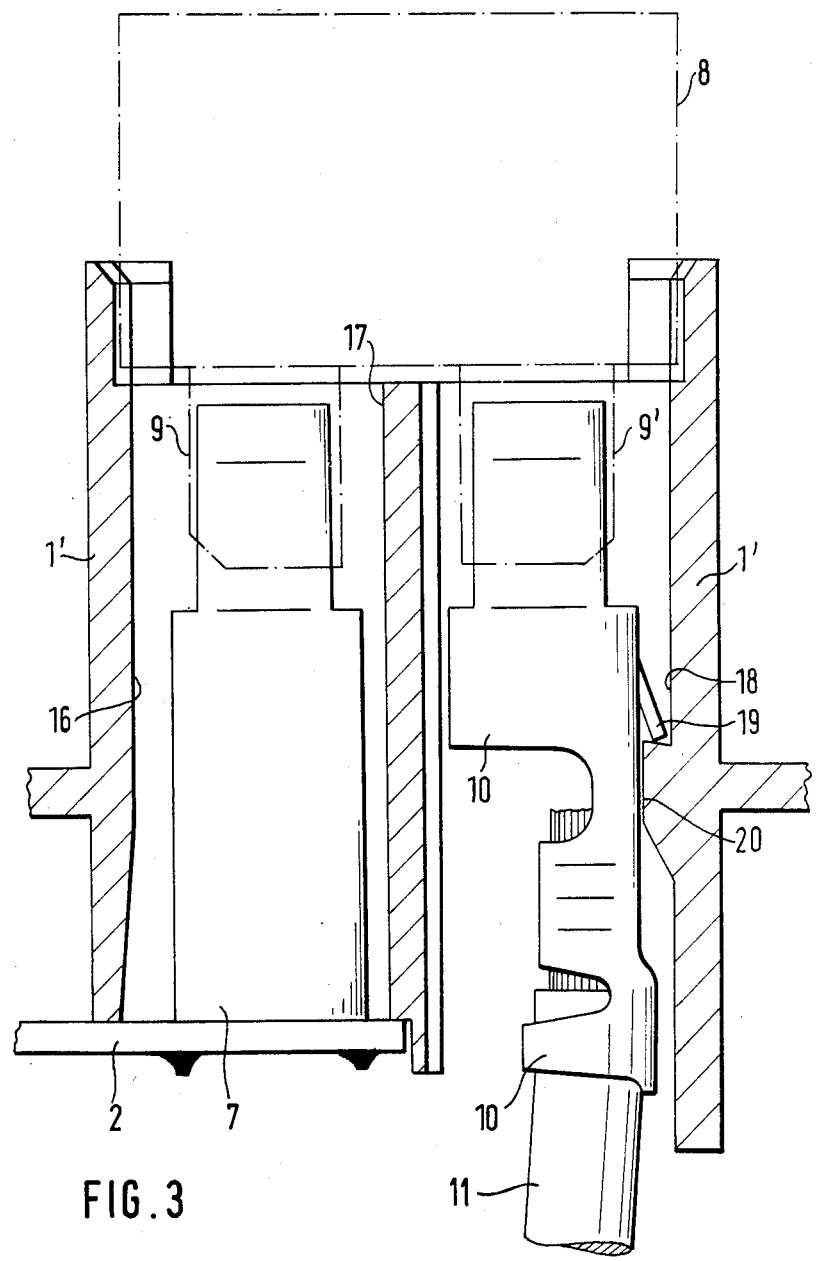

To illustrate more clearly the arrangement of the spring-biased contact parts 7 and 10 in support 5, the cut-out indicated in FIG. 2 is shown in FIG. 3 on an enlarged scale. The contact part 7 is located in a tube-shaped recess or receptacle 16 in housing 1'. Plug-in fuse 8 meshes with its first contact 9 with contact part 7 and is located by a vertical bridge 17 of housing 1'. The second contact 9' of the fuse 8 meshes with the spring-biased contact part 10 which is situated in another tube-shaped receptacle 18 of the housing in such a way that it cannot be inadvertently disconnected therefrom. Cable 11 which leads to a power consumer is attached to contact part 10 prior to the insertion of the contact part 10 into receptacle 18.

As FIG. 3 shows, contact part 10 is inserted into tube-shaped receptacle 18 and retained therein by a resilient finger 19 which projects from contact part 10 and attaches behind a projection 20 of receptacle 18.

In addition to the depicted design with a single-pole separate contact part 10, several adjacent contact parts of this type can be combined into a multiple contact strip and inserted together into several assigned receptacles 18 or a common receptacle.

Figure 4:
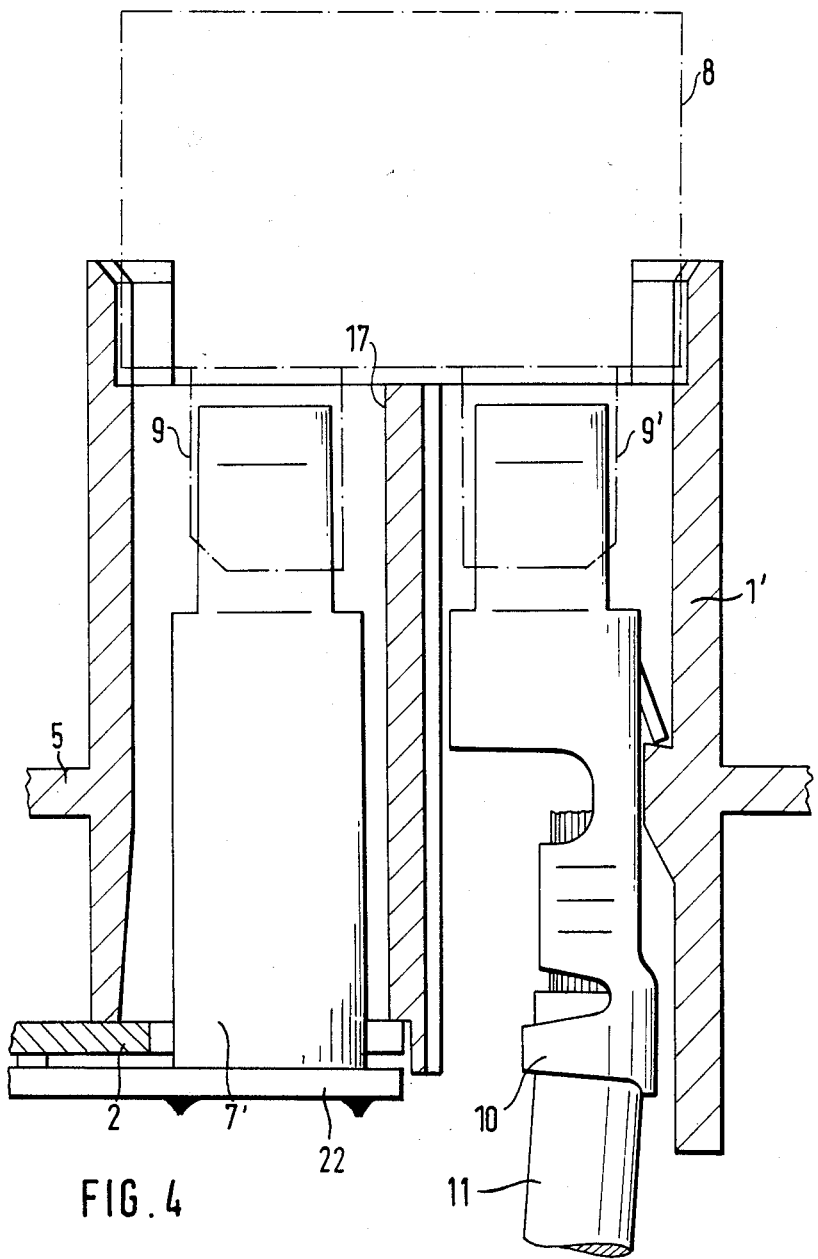

FIG. 4 shows a side view of another arrangement of the elements in the cut-out indicated in FIG. 1. Instead of the threaded terminal end 12 shown in FIG. 2 for the positive feed, a bus bar 22 is attached under printed circuit board 2 which is the positive potential. This bus bar 22 is attached to first contacts 9 of some of plug-in fuses 8 and, to the positive inputs of relays 4. As shown in FIG. 4, busbar 22 extends through the plane of printed circuit board 2 and forms contact part 7' for receiving the first contacts 9 of plug-in fuses 8 or the positive inputs of relays 4. In both cases these contact parts 7' can be designed as a spring-mounted contact part corresponding to contact part 7. To avoid undesired contact between busbar 22 and printed circuit 3, printed circuit board 2 is offset in the area of fuses 8 connected to the busbar (FIG. 1) or forms a contactless opening in the area of the positive inputs of the relays.

Busbar 22 delivers positive potential to all points in and on the printed circuit board without requiring a strip conductor of printed circuit 3 to do so. Since a strip conductor of this type would have to be made relatively wide for a positive feed, the busbar ensures a considerable savings in space for printed circuit 3 and thus a considerable reduction in the size of printed circuit board 2.

While I have shown and described only one embodiment in accordance with the present invention, it is understood that the same is not limited thereto, but is susceptible to numerous changes and modifications as known to those skilled in the art, and I therefore do not wish to be limited to the details shown and described herein, but intend to cover all such changes and modifications as are encompassed by the scope of the appended claims.

I claim:

1. A fuse and distribution box arrangement for motor vehicles wherein an electrical load is connected to a printed circuit board in the distribution box by an electrical fuse, the arrangement comprising a distribution box means for housing a printed circuit board, a printed circuit board having a printed circuit connected to a power supply of a motor vehicle, an electrical fuse having a plurality of contacts, first discrete spring-biased contact means associated with an electrical load for connecting the load to one of the plurality of contacts of the fuse, and second spring-biased contact means associated with said printed circuit for connecting another of said plurality of contacts of said fuse to said printed circuit, and first spring-biased contact means including resilient means for attaching said first spring-biased contact means to said box means, said second spring-biased contact means being directly connected to the printed circuit board wherein the electrical load is connected to the printed circuit by the discrete spring-biased contact means associated with the load being positioned relative to the box means by the resilient means and the fuse interconnecting the first discrete spring-biased contact means associated with the load to the second spring-biased contact means associated with the power supply of the vehicle.

2. The arrangement according to claim 1, wherein a plurality of electrical loads are connected directly to the printed circuit by a plurality of fuses, each of the plurality of electrical loads having a discrete spring-biased contact means associated therewith.

3. The arrangement according to claim 2, wherein the plurality of contacts of each of the plurality of fuses includes knife-like contacts.

4. The arrangement according to claim 3, wherein said plurality of fuses are arranged one behind the other on at least one edge of the printed circuit board.

5. The arrangement according to claim 2, wherein the arrangement includes a bus bar for connecting the plurality of fuses directly to a positive potential of the power source of the vehicle located under the printed circuit board and extending through an edge area of the printed circuit board into receptacles adapted to receive the second spring-biased contact means.

6. The arrangement according to claim 5, wherein the printed circuit board has relays which are connected to the printed circuit, said bus bar extending under the printed circuit board to the relays and, with contact parts, extending through the printed circuit board to positive inputs of the relays.

* * * * *